United States Patent
Leder et al.

(10) Patent No.: US 12,271,669 B1
(45) Date of Patent: Apr. 8, 2025

(54) EXECUTING INSTRUCTION SEQUENCES GENERATED FROM SOFTWARE INTERACTIONS AS PART OF FORMAL VERIFICATION OF A DESIGN UNDER TEST

(71) Applicant: Amazon Technologies, Inc., Seattle, WA (US)

(72) Inventors: Uri Leder, Lotem (IL); Ori Ariel, Ma'ale Adumim (IL); Assaf Fainer, Kefar Sava (IL); Simaan Bahouth, Shefar'am (IL); Max Chvalevsky, Mevaseret Zion (IL); Itai Kahana, Lod (IL)

(73) Assignee: Amazon Technologies, Inc., Seattle, WA (US)

( * ) Notice: Subject to any disclaimer, the term of this patent is extended or adjusted under 35 U.S.C. 154(b) by 578 days.

(21) Appl. No.: 17/709,192

(22) Filed: Mar. 30, 2022

(51) Int. Cl.
G06F 30/30 (2020.01)
G06F 30/3323 (2020.01)
G06F 30/367 (2020.01)

(52) U.S. Cl.
CPC ........ G06F 30/3323 (2020.01); G06F 30/367 (2020.01)

(58) Field of Classification Search
None
See application file for complete search history.

(56) References Cited

U.S. PATENT DOCUMENTS

| 7,240,303 B1 * | 7/2007 | Schubert ................. G06F 30/33 |
| | | 703/15 |
| 8,326,592 B2 | 12/2012 | McMillan |
| 8,533,642 B1 | 9/2013 | Ogilvie et al. |
| 8,781,808 B2 | 7/2014 | Yang |
| 2009/0132991 A1 | 5/2009 | Ganai et al. |

OTHER PUBLICATIONS

K. Datta et al., "Assertion Based Verification Using HDVL," 2004 IEEE Computer Society, Proc. of the 17th Int'l Conference on VLSI Design (VLSID'04), 7 pages. (Year: 2004).*

* cited by examiner

*Primary Examiner* — Leigh M Garbowski
(74) *Attorney, Agent, or Firm* — S. Scott Foster; Kowert, Hood, Munyon, Rankin & Goetzel, P.C.

(57) ABSTRACT

Generated instruction sequences captured from software interactions may be executed as part of formal verification of a design under test. Software-instructed commands to be performed to configure a design under test formatted according to an interface implemented by the design under test can be obtained. A sequence to perform the software-instructed commands may be generated to configure the design under test in a hardware design and verification language. The sequence may then be executed to perform the software-instructed commands to configure the design under test and then perform formal verification on the configured design under test.

20 Claims, 7 Drawing Sheets

EXECUTING INSTRUCTION SEQUENCES GENERATED FROM SOFTWARE INTERACTIONS AS PART OF FORMAL VERIFICATION OF A DESIGN UNDER TEST

BACKGROUND

Formal verification provides a cost effective design tool when implementing different hardware solutions. A formal verification system may generate a mathematical model or representation of a hardware design, then determine whether a proof exists or can be generated that solves the mathematical model (e.g., by providing a proof to demonstrate correctness of a finite state machine). If a proof exists, then it can be assured that the hardware design is logically sound (although further testing for physical implementation features, such as component layout to account for On-Chip Variation and other physically occurring conditions may still be performed). In this way, problems in the hardware design can be identified.

While embodiments are described herein by way of example for several embodiments and illustrative drawings, those skilled in the art will recognize that the embodiments are not limited to the embodiments or drawings described. It should be understood, that the drawings and detailed description thereto are not intended to limit embodiments to the particular form disclosed, but on the contrary, the intention is to cover all modifications, equivalents and alternatives falling within the spirit and scope as defined by the appended claims. As used throughout this application, the word "may" is used in a permissive sense (i.e., meaning having the potential to), rather than the mandatory sense (i.e., meaning must). Similarly, the words "include", "including", and "includes" mean including, but not limited to.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

"Comprising." This term is open-ended. As used in the appended claims, this term does not foreclose additional structure or steps. Consider a claim that recites: "An apparatus comprising one or more processor units . . . " Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112, paragraph (f), for that unit/circuit/component. Additionally, "configured to" can include generic structure (e.g., generic circuitry) that is manipulated by software or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, a buffer circuit may be described herein as performing write operations for "first" and "second" values. The terms "first" and "second" do not necessarily imply that the first value must be written before the second value.

"Based On" or "Dependent On." As used herein, these terms are used to describe one or more factors that affect a determination. These terms do not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

DETAILED DESCRIPTION

Various techniques of executing generated instruction sequences captured from software interactions as part of formal verification of a design under test are described herein. Formal verification techniques offer cost effective verification when designing new hardware, such as integrated circuits. Techniques that can increase the utilization of formal verification systems may reduce design and development costs, decrease the number of undetected bugs, errors, or design flaws, and thus such techniques may be highly desirable. For example, formal verification can be used to prove the correctness of small hardware designs and for larger designs find bugs or partial indications of correctness.

Formal verification techniques, however, have limitations. For example, many hardware designs interact with software applications, which either execute on a hardware design or communicate with the hardware design to perform various operations. One example of this type of software-hardware interaction occurs at the beginning of hardware operation when software is used to initialize and/or otherwise configure the hardware design. Interactions between software and hardware may be performed by various types of interfaces and corresponding protocols. One example of an interface is Advanced RISC Machines (ARM) (Advanced Peripheral Bus) APB interface. However, various other types of interfaces and corresponding protocols may be used to facilitate software and hardware interaction. Because software interacts with and affects the operation of a hardware design, there are verification tasks that would benefit from considering the effects of software performance on hardware design. For instance, bugs, flaws, or characteristics of software interactions with hardware can, potentially, have negative consequences on the performance of a hardware design. Therefore, if the effects of software interactions are not considered when performing formal verification, then there may be undetected problems in a hardware design.

Many formal verification tools, however, are not equipped to understand or account for the effects of software interactions. For instance, formal verification tools utilize a synthesizable design under test. To measure the effects of software, then the software would also have to be synthesizable to be analyzed using formal verification techniques. However, given the complexities of software, the software may not be synthesizable in many scenarios. While attempts to model the effects of software could be made using constraints that are specified for the design under test, formal verification algorithms perform worse when running with multiple constraints even if those constraints actually narrow the number of possible reachable states of the design under test.

In various embodiments, executing generated instruction sequences captured from software interactions as part of formal verification of a design under test provide a way to both account for and provide the effects of software interactions on a design under test using formal verification techniques without requiring a synthesizable version of the software or adding constraints to debase the performance of formal verification. These techniques may provide a fast and reliable check of combined software and hardware taken as a single design under test. These techniques may obtain the parameters of software interactions (e.g., commands) from either a virtual platform, emulation or simulation runs of the software. The execution of the actual software can be used to accurately capture the effects of software without generating a synthesizable model of software. Moreover, execution of the actual software may allow for obtaining only the information needed for configuring a particular piece of hardware. This in turn may reduce the time and effort needed to deploy those tools for this particular task.

In various embodiments, the techniques for executing generated instruction sequences captured from software interactions as part of formal verification of a design under test may provide a way to convert the information captured from the execution of actual software into a sequence format that can be understood as part of executing formal verification tasks. Various formats of the sequence, such as a "reset sequence" may be used according to the formal verification engines, applications, or tools that may be used to perform formal verification analysis. Sequences, like a "reset sequence" may be a directed test performed by a verification system before deploying actual formal algorithms. As such its runtime may be very fast, as it may, for example, take the design under test to a state created by the interactions of the software by the hardware. In this way, various embodiments can connect real software interaction effects on a design under test as may be achieved via the supported interface and corresponding protocol. For example, in some embodiments, techniques may support a user providing the software to be executed as well as the design under test, and a formal verification system may appear to be able to execute the software on the design under test without affecting the performance of formal verification.

Figure 1:
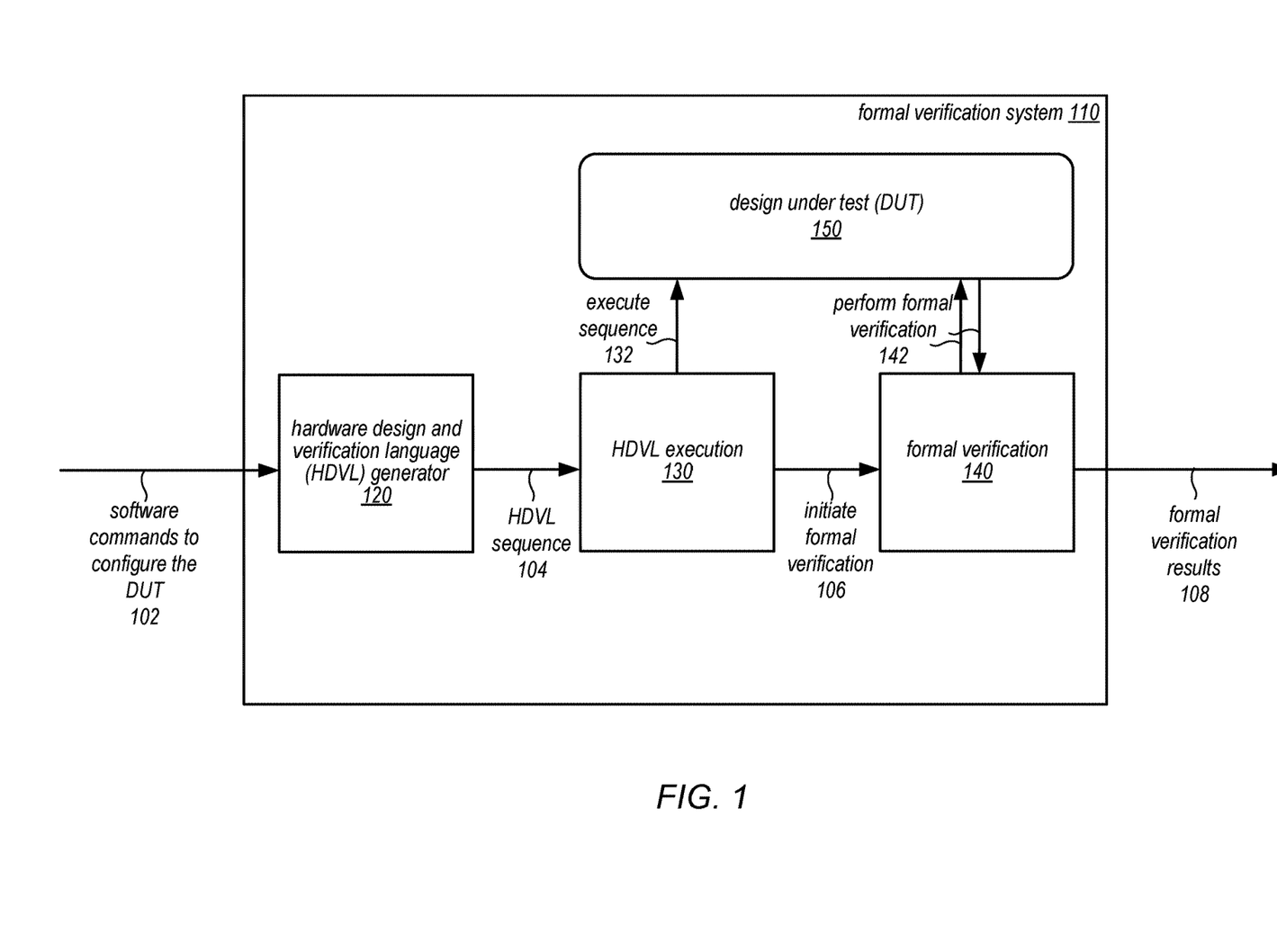
FIG. 1 illustrates a logical block diagram of executing generated instruction sequences captured from software interactions as part of formal verification of a design under test, according to some embodiments.

FIG. 1 illustrates a logical block diagram of executing generated instruction sequences captured from software interactions as part of formal verification of a design under test, according to some embodiments. A formal verification system 100 may be a stand-alone tool, application or service, or may be implemented as part of a larger development application or suite of tools for hardware design, such as system verification application 210 discussed below with regard to FIG. 2. Formal verification system 110 may perform formal verification techniques on a hardware design described or otherwise specified according to a hardware language (e.g., such as hardware description languages like VHDL, Verilog, and RHDL, among others). This hardware design may be considered the design under test 150 (sometimes referred to as a DUT). A design under test 150 may include various features or components to accept various inputs, perform various operations, and provide various outputs.

Formal verification system 110 may support formal verification that accounts for the effects of software that interactions design under test 150, as discussed above. For example, formal verification system 110 may implement an interface (e.g., as part of a graphical user interface, command line interface, or other type of interface) through which software commands 102 to configure the design under test 150 can be obtained. As discussed in detail below with regard to FIGS. 2-4, in some embodiments, formal verification system 110 may implement features to execute and capture the software commands as part of formal verification system 110, while in other embodiments, a file, data structure, or other object may be received at formal verification system 110 that describes the software commands 102.

Formal verification system 110 may implement a hardware design and verification language (HDVL) generator 120. For example, a hardware design and verification language, such as System Verilog, may be used to represent the software commands 102, in accordance with the order, timing, or other information from software commands 102, as an HDVL sequence, such as sequence, that when executed produce a state of design under test 150 (e.g., an initial state) that is as if the software was executing via an interface to interact with the hardware design of the design under test 150. This HDVL sequence 104 may be provided to HDVL execution stage 130 which may execute the sequence 132 with respect to design under test 150. For example, according to the formal verification system 110 tools, engines, or other components that perform formal verification, the sequence may be executed as an initialization or other pre-formal verification set of operations performed to configure the design under test 150 as if the software were configuring the design under test using the supported interface and protocol.

Once the HDVL sequence has executed 132, formal verification may be initiated as indicated at 106. For example, formal verification system 110 may implement a formal verification engine, tool, or other sub-system that applies or otherwise performs formal verification 142 with respect to design under test 150 in the state produced by the execution of the sequence at 132. In this way, formal verification techniques can be used to prove the correctness of design under test 150 as it would be in accordance with the effects of software interactions or find bugs or other design or software flaws or partial indications of correctness. Formal verification 140 may then provide the formal verification results 108 via an interface, (e.g., through the graphical user interface, the command line interface, or the other type of interface). The results 108 may indicate the proof of correctness or provide indications of bugs, flaws, or other errors that may be present.

Please note that the previous description of executing generated instruction sequences captured from software interactions as part of formal verification of a design under test is merely provided as a logical example. Different numbers of components or configuration of components may be implemented.

This specification continues with a general description of a system verification application, which may implement executing generated instruction sequences captured from software interactions as part of formal verification of a design under test. Various examples of different components/modules, or arrangements of components/modules that may be implemented in the system verification application may then be discussed. A number of different methods and techniques to implement executing generated instruction sequences captured from software interactions as part of formal verification of a design under test are then discussed, some of which are illustrated in the accompanying flowchart. Various examples are provided throughout the specification.

Figure 2:
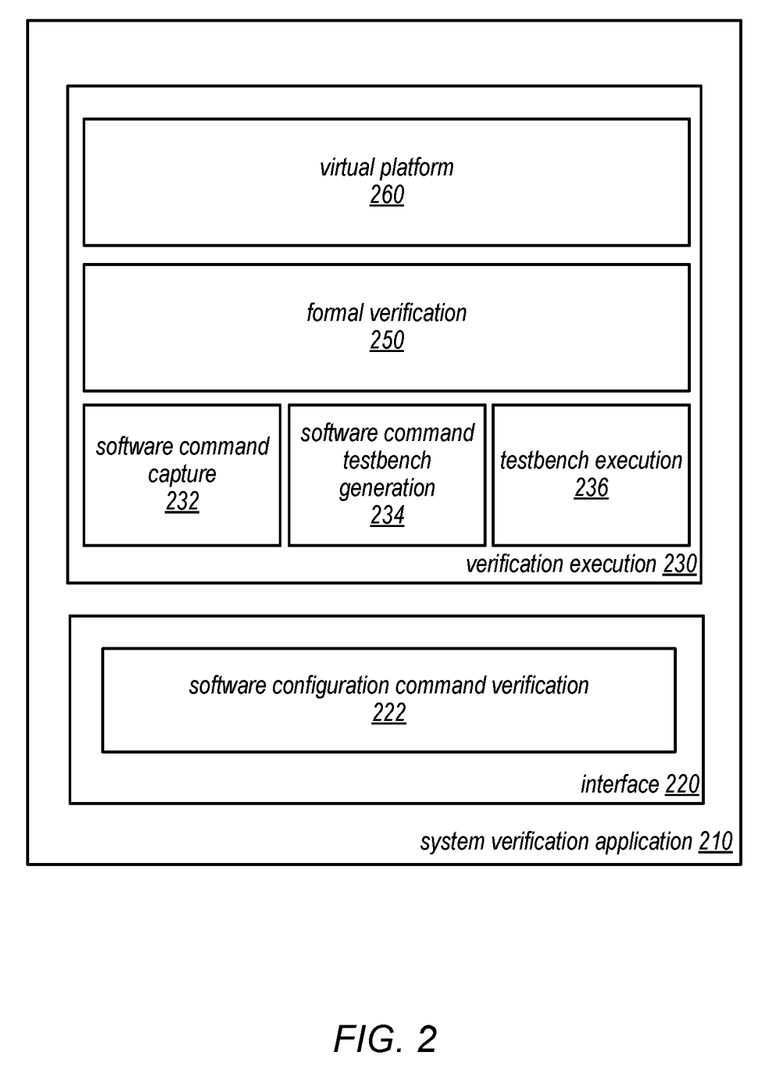
FIG. 2 is a logical block diagram illustrating a system verification application that may implement executing generated instruction sequences captured from software interactions as part of formal verification of a design under test, according to some embodiments.

FIG. 2 is a logical block diagram illustrating a system verification application that may implement executing generated instruction sequences captured from software interactions as part of formal verification of a design under test, according to some embodiments. System verification application 210 may provide a set of verification tools or functions (or may be implemented as part of a larger Integrated Development Environment (IDE)) to perform, among other operations, the development and verification of hardware designs via various verification features to develop a language-specified hardware design. System verification application 210 may implement various features, such as interface 220 and verification execution 230, which may be used to perform various verification techniques.

For example, interface 220 may be a programmatic interface implementing one or multiple Application Programming Interfaces (APIs) to invoke different operations, including various requests for executing generated instruction sequences captured from software interactions as part of formal verification of a design under test, a GUI interface that provides various visual control elements for editing, compiling, or other development activities, and/or a command line interface, which may also provide command line controls to edit, compile, or perform other development, design, and/or verification activities. In some embodiments, interface 220 may act as a control console that allows for the configuration of system verification application 210 features. For instance, interface 220 may support requests to configure various parameters or options of verification execution 230, such as providing the software (or features of the software) that may interact with a hardware design which may be executed using virtual platform 260 and the hardware language, assertions, assumptions, cover features, or other criteria or information for performing various verification techniques, such as for formal verification 250. Like FIG. 4 below, interface 220 may provide input support for incorporating software command verification 222 as part of performing formal verification, (including code, scripts, or visual objects that represent the operations of a testbench performed by verification execution 230).

Interface 220 may also implement verification task result visualization. Different kinds of verifications may result in different types of visualizations for the verification task results. For example, paths through logical block diagrams may be illustrated to identify a path in a hardware design that traces an error, or state tables may indicate when erroneous or invalid states are achieved by a hardware design or a source of an error, such as a software instruction or command.

System verification application 210 may implement verification execution 230, which may support a common feature set (in addition to interface 220) across multiple different types of verifications supported by different verification engines. For instance, testbench execution tracking may provide a common interface for identifying testbench milestones, estimates, or other tracking features. Testbench debug may implement various debug tools for tracing errors, identifying alternatives or errors proactively (e.g., prior to test), as well as different linking errors in visualizations to error definitions for different verification operations, in some embodiments. In some embodiments, testbench task measurement may provide performance metrics, benchmarks, or other assessments of hardware designs under verification. As noted above, different types of verification techniques may be supported. For example, formal verification 250, static verification, design simulation verification, design emulation verification, and hardware prototyping (e.g., for FPGAs), among other verification engine(s) features. Virtual platform 260 may be implemented, in some embodiments, to execute software in order to capture software and hardware interactions, as discussed in detail above with regard to FIG. 1 and below with regard to FIGS. 3-6.

In various embodiments, the components illustrated in FIG. 2 may be implemented directly within computer hardware, as instructions directly or indirectly executable by computer hardware (e.g., a microprocessor or computer system), or using a combination of these techniques. For example, the components of FIG. 2 may be implemented by a system that includes a number of computing nodes (or simply, nodes) as part of a service, each of which may be similar to the computer system embodiment illustrated in FIG. 7 and described below, in one embodiment. In various embodiments, the functionality of a given system or service component (e.g., a component of system verification application 210) may be implemented by a particular node or may be distributed across several nodes). In some embodiments, a given node may implement the functionality of more than one service system component (e.g., more than one development application component).

Figure 3:
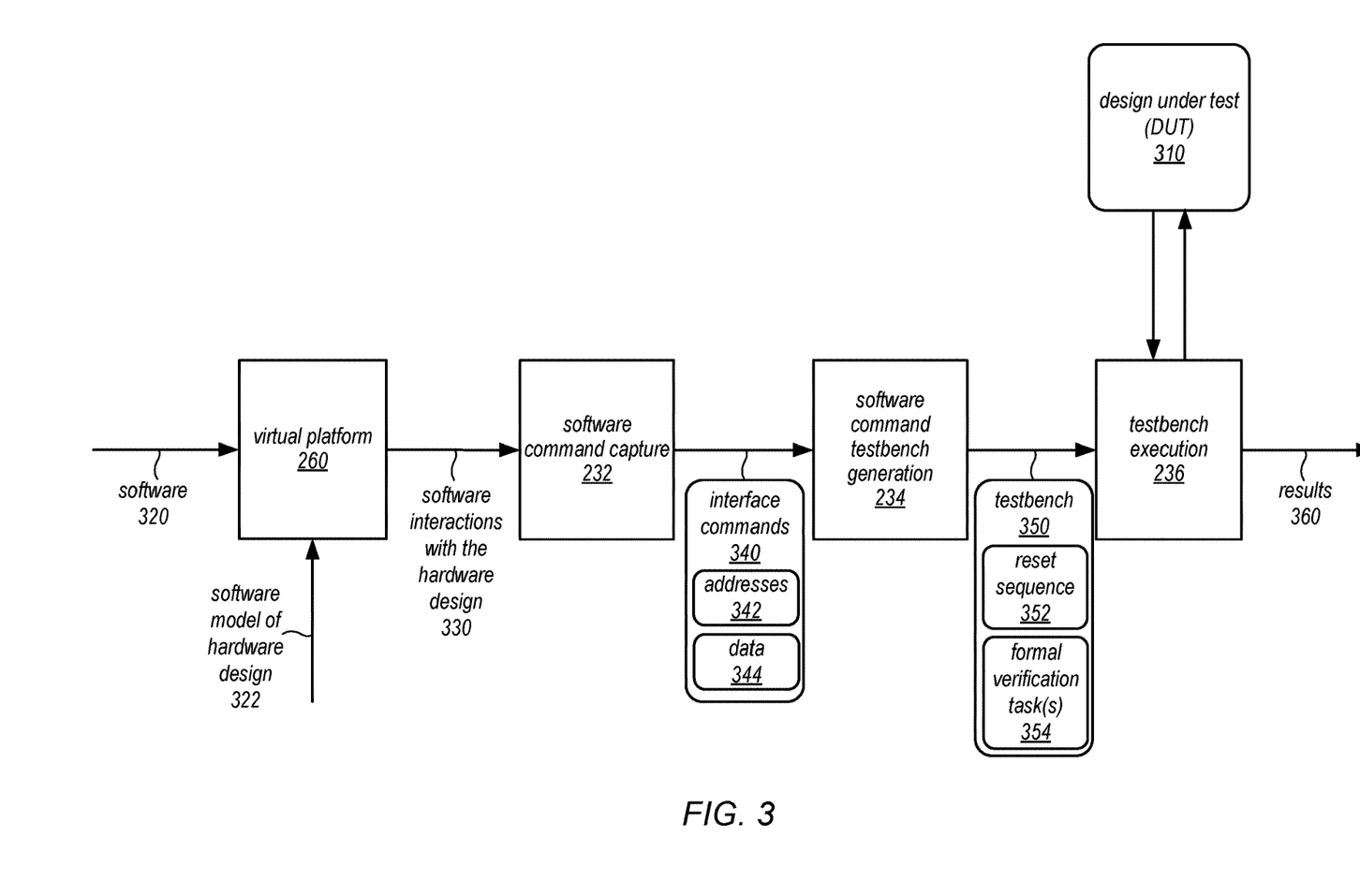
FIG. 3 is a logical block diagram illustrating software command capture to generate a testbench with a sequence for incorporating software and hardware interactions for formal verification, according to some embodiments.

FIG. 3 is a logical block diagram illustrating software command capture to generate a testbench with a reset sequence for incorporating software and hardware interactions for formal verification, according to some embodiments. Virtual platform 260 may be a tool that is implemented to provide a software-based prototype of hardware designs, such as design under test 310, so that given software for interacting with the software prototype, virtual platform 260 can execute the software in conjunction with the hardware design (e.g., allowing the software to execute and thus interact with the hardware design). As illustrated in FIG. 3, both software 320 and a software model of the hardware design 322 may be provided to virtual platform 260. Software 320 may be specified in various languages, scripts, or other formats for execution on virtual platform 260. In some embodiments, virtual platform 260 may include a compiler to compile the software for execution with respect to software model of the hardware design 322.

Software model of the hardware design 322 may be specified in a software-based hardware modeling language, such SystemC. Instead of specifying the hardware design through a hardware description language, a software-based hardware modeling language (sometimes referred to as a system-level modeling language) may provide an event-driven simulation interface to simulate various hardware processes as part of a virtual platform, like virtual platform 260. As with software, the software model of the hardware design 322 may be compiled into an executable form. When the executable form of the software model of the hardware design 322 is executed in conjunction with the executable software, a simulation of the software's interactions with the hardware design is performed. Note that virtual platform 260 is one example of technique that can be used to capture software commands. Other techniques, such as various kinds of emulators may be used to execute software commands with respect to a hardware design for capture.

As indicated at 330, software command capture 330 may obtain the software interactions with the hardware design. For example, software command capture 232 may read an execution history, log, or other simulation output to obtain software interactions with the hardware design. Note that software may have interactions with multiple different hardware components or systems in addition to the hardware design being verified. Thus software command capture 232 may be able to search for various identifying information (e.g., protocol command signatures or other identifying information, such as a hardware device name, addresses, or other features) to locate those software interactions with the hardware design.

Software command capture 232 may parse, extract, and format the interface commands that represent the interactions between software and the hardware design, in various embodiments. For example, the software interactions may be structured as commands according to a protocol supported by the interface used to facilitate interactions between software and hardware. Such protocols may utilize a predefined schema for structuring the commands (and responses to commands). For example, if the interface and protocol is based on a peripheral bus interface and protocol, such as APB, then the commands may be formatted as transactions. Software command capture 232 may be able to identify the relevant fields in the transactions to extract information such as the address or other location information to which a command (e.g., to write) is sent, as well as the data to be sent (e.g., to be written). Additionally, software command capture 232 may obtain information about the timing, sequencing, or ordering of commands.

Software command capture 232 may provide the captured interface commands 340, including features such as the addresses or locations 342 (e.g., a hardware design address or location) as well as the data 344 for the addresses 342 to software command testbench generation 234. Software command testbench generation 234 may generate a sequence to cause the effects of the interface commands to be made to the design under test 310 such that the design under test 310 is in a state that would be produced by interface commands 340 if they were executed over the interface by the software to the hardware design of design under test 310. For example, in some embodiments, software command testbench generation 234 may generate a reset sequence for the software commands, which may be performed to program, set, or otherwise initialize the values of the various addresses 342 in the hardware design with the corresponding data 344. This reset sequence 352 may be included in a testbench 350 that is generated for performing formal verification 354 by software command testbench generation 234.

Software command testbench generation 234 may utilize one or more templates and sequence generation rules, in some embodiments, to construct these sequences in testbench 350. For example, testbench 350 may be a test module that is synthesizable (e.g., like design under test 310) which can be used to perform verification tasks like formal verification. Testbench 350 may be specified in a language, such as System Verilog, or other hardware description and verification language (HDVL). The templates may be HDVL templates for sequences, mapping various commands supported by an interface and protocol to respective sequence statements in HDVL. The sequence generation rules may identify which addresses 342 and which data 344 should be written to which portions of the HDVL template to complete the reset sequence 352. In addition to generate reset sequence 352, software command testbench generation 234 may also include formal verification task(s) 354, by including features such as constraints (e.g., specified using assume statements) and checkers (e.g., specified using assert statements) to perform formal verification in accordance with the constraints and checkers.

Testbench execution 236 may receive testbench 350 and access design under test 310 in order to execute the testbench 350. Execution of testbench 350 may include performing the reset sequence 352 as part of initializing or otherwise brining the design under test to a particular state that would occur as a result of software and hardware interactions via an interface. Testbench execution 236 may then perform the various formal verification task(s) 354 to determine the correctness of design under test 310 in the particular state. Results 360 may be provided, which may include paths through logical block diagrams that may be illustrated to identify a path in design under test 310 that traces an error, or state tables may indicate when erroneous or invalid states are achieved by the design under test 310 or a source of an error, such as a software instruction or command.

Figure 4:
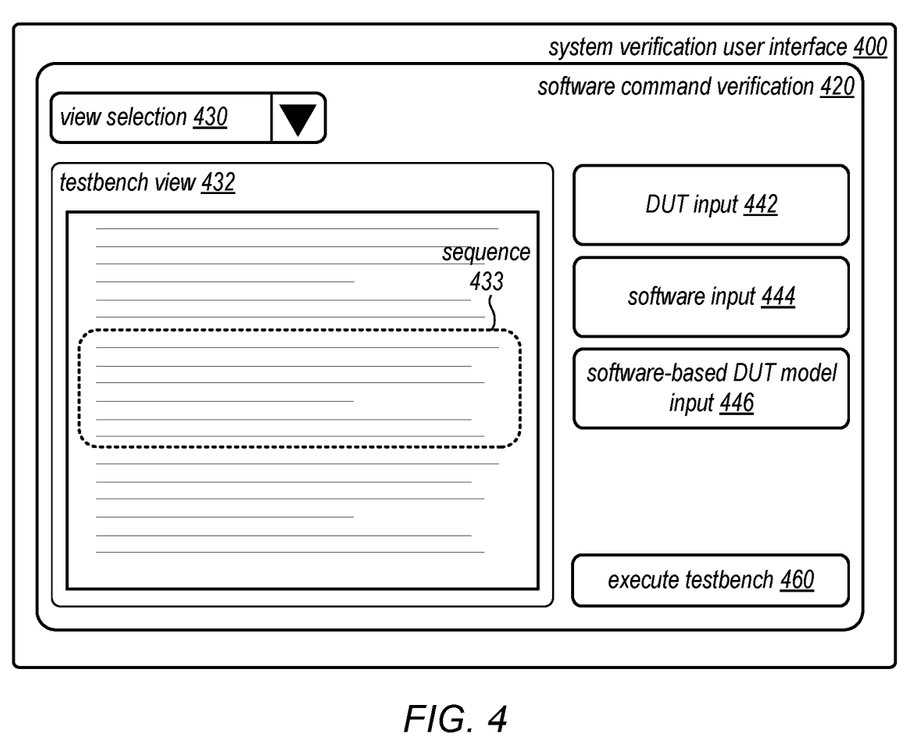
FIG. 4 is an example of an interface for performing software command verification as part of formal verification for a design under test, according to some embodiments.

FIG. 4 is an example of an interface for performing software command verification as part of formal verification for a design under test, according to some embodiments. System verification user interface 400 may be a graphical user interface implemented as part of interface 220, in some embodiments, to provide various different interface elements for creating, modifying, and/or executing verification that implements performing software command verification as part of formal verification for a design under test. For example, software command verification 420 may implement various menus, buttons, lists, drop-down boxes, selectors, text, inputs, upload mechanisms, and/or other graphical user interface elements to allow a user to perform formal verification using software commands, in some embodiments.

In some embodiments, software verification 420 may allow a user to select various views of the features of verification to be performed, as indicated at view selection 430 (e.g., which may be a user interface element of various types for providing different selectable options). For instance, testbench view 432 is illustrated in FIG. 4, which may display in a textual or graphical format, the testbench design for interaction by a user (e.g., including the editing of various features of the testbench), including a feature that highlights the generated sequence 433 that will be executed to plate the design under test in a state before the performance of formal verification tasks. Other views not illustrated may be supported, such as software view, which may provide a text or other visualization of the software to be considered when performing formal verification. Another view, such as software-based model of the design under test may be displayed (e.g., in SystemC) for editing or other interaction. In some embodiments, multiple testbenches may be associated with a single evaluation project, therefore multiple different testbenches (e.g., corresponding to different tests for different states) may be provided via system verification user interface 400.

Different interaction paths for performing software command verification may be supported. For example, in some embodiments, verification system 210 may accept as input a design under test and the software to execute and then may perform the various stages to simulate (or emulate), capture, and include in a testbench software commands for formal verification (e.g., similar to the techniques discussed above with regard to FIG. 3). In some embodiments, verification system 210 may accept other inputs to perform software command verification, such as allow a user to input the software-based design under test model for simulation. As illustrated in FIG. 4, various different input user interface elements, such as DUT input 442, software input 444, and software-based DUT model input 446 may be implemented, which may support various upload, text input, or other input interfaces for obtaining these inputs.

As indicated at 460, a user interface element may be implemented to cause the execution of the testbench that utilizes a reset sequence to perform software commands and perform formal verification. For example, the execution of the testbench may be performed to instantiate or otherwise create a design under test, execute the reset sequence, and begin formal verification using the assumptions and assertions.

The examples discussed above with regard to FIGS. 1-4 have been given in regard to an example system verification application. Note that various other types or configurations of applications, including hardware development applications, may implement extending cover properties in formal verification to generate failure traces that reach end-of-test and thus may implement these techniques. In addition to the examples given above, the techniques discussed below with regard to FIGS. 6 and 7 may be also implemented using the various components discussed above as well as different types of systems or devices that perform formal verification on a hardware design.

Figure 5:
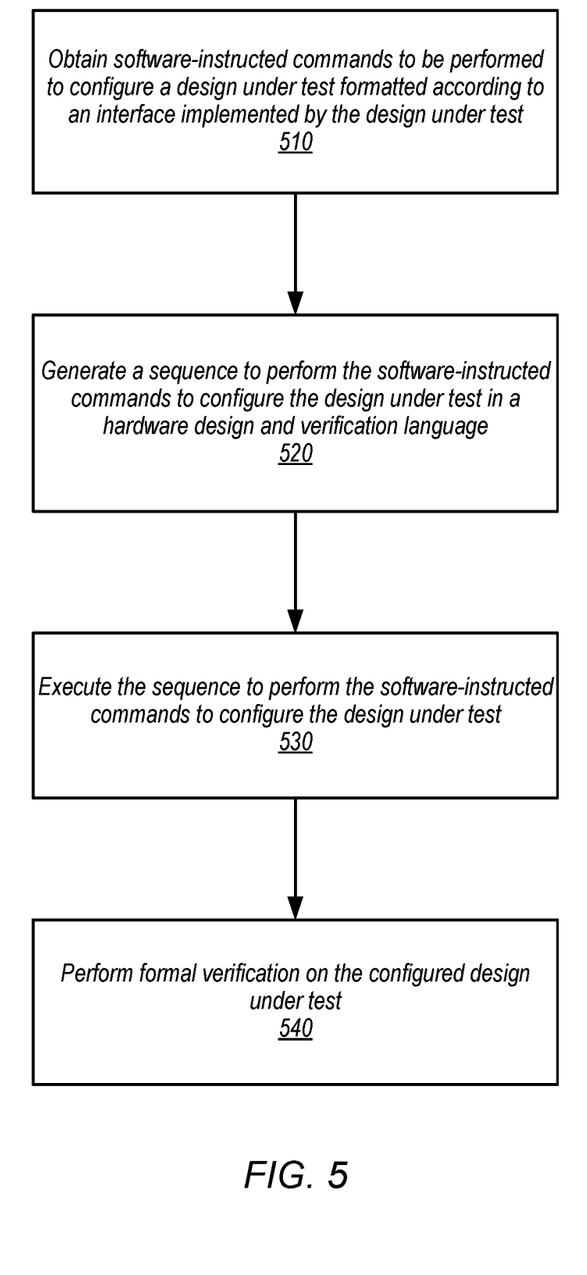
FIG. 5 is a high-level flowchart illustrating various methods and techniques to implement executing generated instruction sequences captured from software interactions as part of formal verification of a design under test, according to some embodiments.

FIG. 5 is a high-level flowchart illustrating various methods and techniques to implement executing generated instruction sequences captured from software interactions as part of formal verification of a design under test, according to some embodiments. A language-specified hardware design may be received, in various embodiments. For example, the hardware design may be specified according to a hardware language like Verilog or VHSIC Hardware Definition Language (VHDL). The language-specified hardware design may be stored in a file, data object, data structure, or other portion of data that supports storing a language-specified hardware design, in some embodiments. In various embodiments, a verification system may accept as a single verification task, job, or operation, the hardware design as part of a request to create, execute, initiate, or otherwise perform formal verification on the hardware design.

As indicated at 510, software-instructed commands to be performed to configure a design under test may be obtained, in various embodiments. The software-instructed commands may be formatted according to an interface implemented by the design under test. For example, if the design under test is a hardware design for a peripheral hardware device, then a peripheral bus and corresponding peripheral bus protocol may be the format of the software-instructed commands.

The software commands may be obtained in various ways. For example, as discussed above with regard to FIG. 3, a virtual platform, emulation or other simulation technique may be used to compile and execute software with respect to a software-based model of the design under test. Interactions that occur when the software interacts with the software-based model may be recorded and parsed to extract the software instruction commands, as discussed in detail below with regard to FIG. 7. In some embodiments, the software-instructed commands may be obtained by accessing a database (or other data store) of stored software commands that are registered according to a user identifier, project identifier, or other identifier. A request may be received to use the software-instructed commands, which may cause the database to be accessed using an identifier. In this way, software-instructed commands may be reused across different testing scenarios (e.g., for use in different testbenches).

In some embodiments, the software-instructed commands may be received via an interface (e.g., as a file or other data object that describes the commands). In some embodiments, the software instructed commands may be captured as part of a formal verification analysis interface that causes execution of a formal verification task for given software and a design under test. As noted earlier, the formal verification task may be received via various types of interfaces (e.g., programmatic interfaces to upload a task file) or user interfaces, such as command line, text editors, or graphical user interfaces that allow a user to enter the formal verification task. A formal verification task may be specified according to a script or other human-readable programming language, supported by the verification system that includes various assumptions and assertion statements, including statements of cover properties.

As indicated at 520, a sequence to perform the software-instructed commands to configure the design under test in a hardware design and verification language may be generated, in various embodiments. For example, System Verilog may be used as a language to specify the sequence as an ordered set of operations (e.g., writes) to various locations in the design under test. Timing or other sequencing information may be included in order to maintain an ordering of operations that matches the performance of the software commands by the software, in some embodiments.

As indicated at 530, the sequence may be executed to perform the software instructed commands to configure the design under test. For example, the sequence may be implemented as part of a testbench, as discussed in detail above and below with regard to FIG. 7, which may execute the sequence as part of a testbench module that is implemented by a verification system. The testbench module may "execute" the operations on the design under test so that the state of the design under test corresponds to the state of the hardware design of the design under test if the software were to have commanded the hardware design over the interface.

The sequence may, in some embodiments, place the design under test in an initialized state, in some embodiments.

As indicated at 540, formal verification may be performed on the configured design under test, in some embodiments. As discussed above, formal verification may be included as part of a testbench or other formal verification task definition. Various assertions and assumptions may be checked as part of performing the various mathematical convergence techniques of formal verification to check for convergence. Because the design under test is configured to be in a state consistent with the execution of the software (e.g., an initial state), the formal verification results that may be determined can proof of correctness (or identify errors) that encompass of the software performance (at least as it relates to the hardware design of the design under test).

Figure 6:
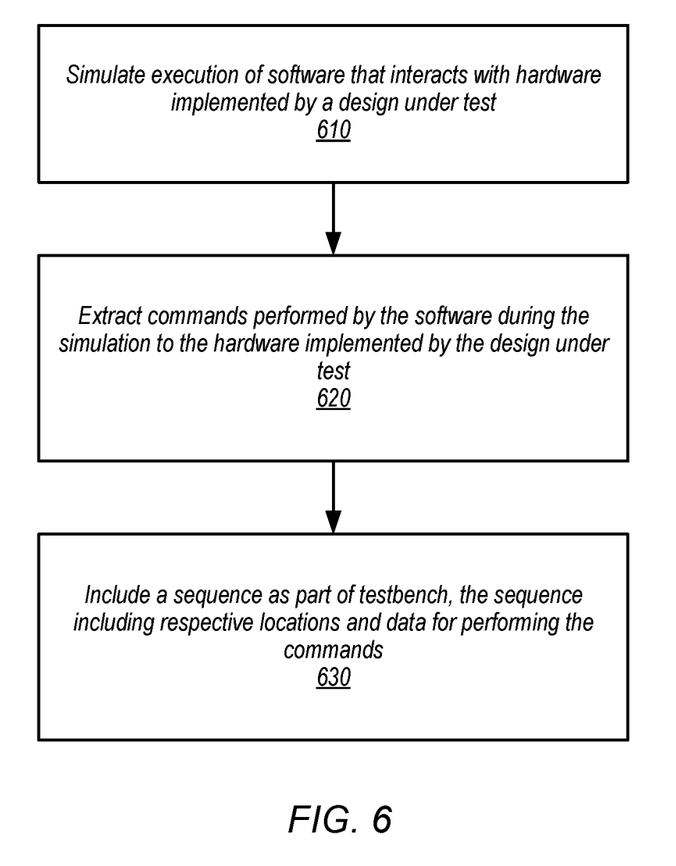
FIG. 6 is a high-level flowchart illustrating various methods and techniques to implement capturing software commands for executing as part of formal verification of a design under test, according to some embodiments.

FIG. 6 is a high-level flowchart illustrating various methods and techniques to implement capturing software commands for executing as part of formal verification of a design under test, according to some embodiments. Software that interacts with hardware implemented by a design under test may be obtained as source code or as an executable, in some embodiments. As indicated at 610, execution of the software that interacts with the design under test may be simulated, in some embodiments. For example, virtual platform-based techniques may be implemented that use a software defined model of the hardware implemented by a design under test (e.g., as specified in SystemC). The software defined model can be compiled and then executed in conjunction with the software in order to simulate the execution of the software. Other techniques, such as implementing the specification of the design under test in the hardware description language on a hardware emulator, can be used as a target for the software, including the various commands that may be performed by executing the software.

As indicated at 620, commands performed by the software during the simulation to the hardware implemented by the design under test may be extracted, in some embodiments. For example, an execution history, log, or other simulation output may be scanned, searched, or parsed to identify protocol commands from the software to the hardware. Regular expression searches, for example, could be used to identify key words or patterns that match the various fields of commands. In some embodiments, the locations at which commands are performed (e.g., addresses) and the data used to perform the commands (e.g., data values to be written to the addresses) may be extracted as part of extracting the commands.

As indicated at 630, a sequence including respective locations data may be included as part of a testbench, in some embodiments. The sequence may include respective locations and data for performing the commands. For example, as discussed above, a testbench may be a test module that is synthesizable (e.g., like a design under test) which can be used to perform verification tasks like formal verification. The sequence may be specified in a language, such as System Verilog, or other hardware description and verification language (HDVL), which may also be used to specify the testbench. One or more rules, scripts, or other generation techniques may be used to map extracted commands into a sequence format (e.g., which may be specified as an HDVL template). The testbench may also include formal verification task(s), such as constraints (e.g., specified using assume statements) and checkers (e.g., specified using assert statements) to perform formal verification in accordance with the constraints and checkers.

Various ones of the methods described herein may be implemented in software, hardware, or a combination thereof, in different embodiments. In addition, the order of the blocks of the methods may be changed, and various elements may be added, reordered, combined, omitted, modified, etc. Various modifications and changes may be made as would be obvious to a person skilled in the art having the benefit of this disclosure. The various embodiments described herein are meant to be illustrative and not limiting. Many variations, modifications, additions, and improvements are possible. Boundaries between various components and operations are somewhat arbitrary, and particular operations are illustrated in the context of specific illustrative configurations. Other allocations of functionality are envisioned and may fall within the scope of claims that follow. Finally, structures and functionality presented as discrete components in the exemplary configurations may be implemented as a combined structure or component. These and other variations, modifications, additions, and improvements may fall within the scope of embodiments as defined in the claims that follow.

Figure 7:
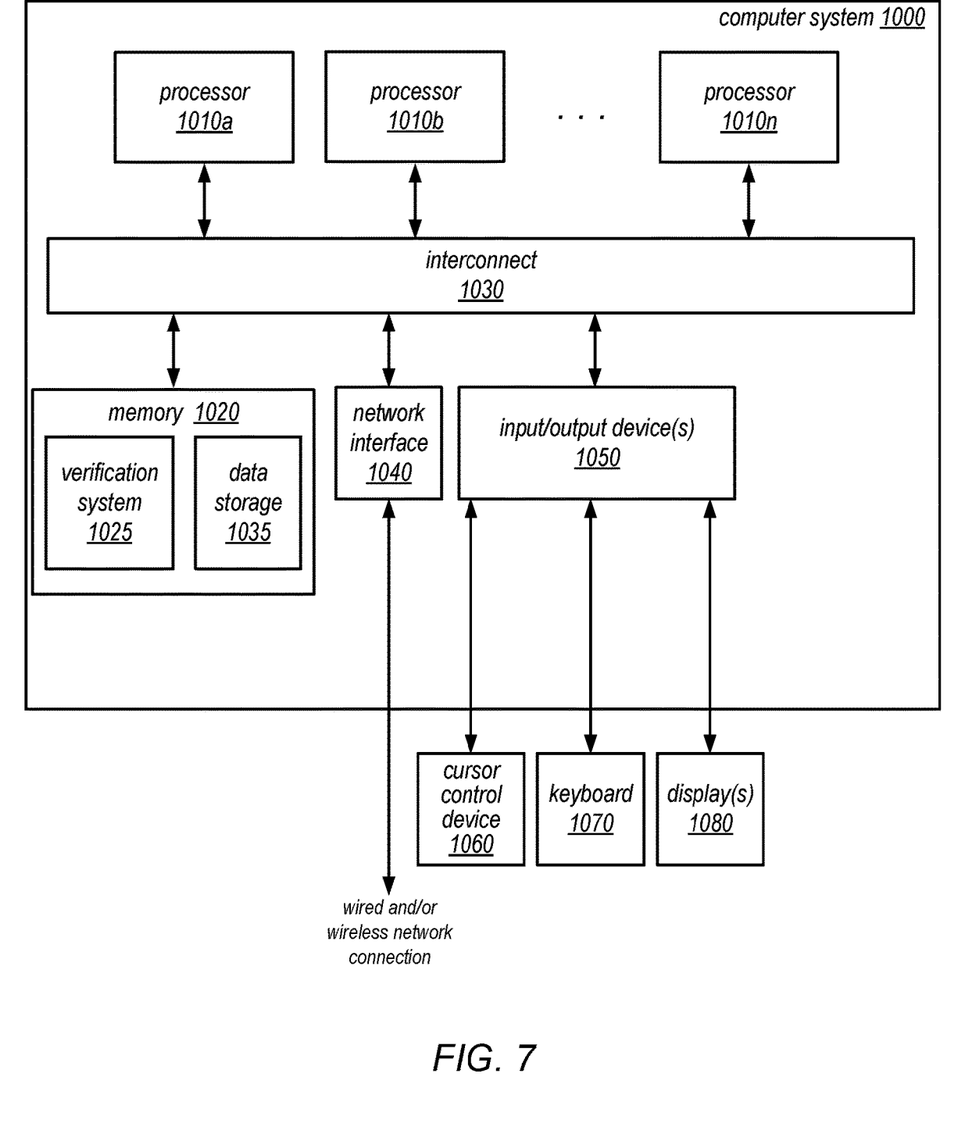
FIG. 7 is an example computer system, according to some embodiments.

Embodiments of executing generated instruction sequences captured from software interactions as part of formal verification of a design under test as discussed above may be implemented as part of a computer system. One such computer system is illustrated by FIG. 7. In different embodiments, computer system 1000 may be any of various types of devices, including, but not limited to, a personal computer system, desktop computer, laptop, notebook, or netbook computer, mainframe computer system, handheld computer, workstation, network computer, a camera, a set top box, a mobile device, a consumer device, video game console, handheld video game device, application server, storage device, a peripheral device such as a switch, modem, router, or in general any type of computing node, compute node, computing device, compute device, or electronic device.

In the illustrated embodiment, computer system 1000 includes one or more processors 1010 coupled to a system memory 1020 via an input/output (I/O) interface 1030. Computer system 1000 further includes a network interface 1040 coupled to I/O interface 1030, and one or more input/output devices 1050, such as cursor control device 1060, keyboard 1070, and display(s) 1080. Display(s) 1080 may include standard computer monitor(s) and/or other display systems, technologies or devices. In at least some implementations, the input/output devices 1050 may also include a touch- or multi-touch enabled device such as a pad or tablet via which a user enters input via a stylus-type device and/or one or more digits. In some embodiments, it is contemplated that embodiments may be implemented using a single instance of computer system 1000, while in other embodiments multiple such systems, or multiple nodes making up computer system 1000, may host different portions or instances of embodiments. For example, in one embodiment some elements may be implemented via one or more nodes of computer system 1000 that are distinct from those nodes implementing other elements.

In various embodiments, computer system 1000 may be a uniprocessor system including one processor 1010, or a multiprocessor system including several processors 1010 (e.g., two, four, eight, or another suitable number). Processors 1010 may be any suitable processor capable of executing instructions. For example, in various embodiments, processors 1010 may be general-purpose or embedded processors implementing any of a variety of instruction set architectures (ISAs), such as the x86, PowerPC, SPARC, or MIPS ISAs, or any other suitable ISA. In multiprocessor systems, each of processors 1010 may commonly, but not necessarily, implement the same ISA.

In some embodiments, at least one processor 1010 may be a graphics processing unit. A graphics processing unit or GPU may be considered a dedicated graphics-rendering device for a personal computer, workstation, game console or other computing or electronic device. Modern GPUs may be very efficient at manipulating and displaying computer graphics, and their highly parallel structure may make them more effective than typical CPUs for a range of complex graphical algorithms. For example, a graphics processor may implement a number of graphics primitive operations in a way that makes executing them much faster than drawing directly to the screen with a host central processing unit (CPU). In various embodiments, graphics rendering may, at least in part, be implemented by program instructions that execute on one of, or parallel execution on two or more of, such GPUs. The GPU(s) may implement one or more application programmer interfaces (APIs) that permit programmers to invoke the functionality of the GPU(s). Suitable GPUs may be commercially available from vendors such as NVIDIA Corporation, ATI Technologies (AMD), and others.

System memory 1020 may store program instructions and/or data accessible by processor 1010. In various embodiments, system memory 1020 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing desired functions, such as those described above are shown stored within system memory 1020 as program instructions, such as program instructions to implement a verification system 1025 (like formal verification system 110 or verification system 210 discussed above with regard to FIGS. 1 and 2) and data storage 1035, respectively. In other embodiments, program instructions and/or data may be received, sent or stored upon different types of computer-accessible media or on similar media separate from system memory 1020 or computer system 1000. Generally speaking, a non-transitory, computer-readable storage medium may include storage media or memory media such as magnetic or optical media, e.g., disk or CD/DVD-ROM coupled to computer system 1000 via I/O interface 1030. Program instructions and data stored via a computer-readable medium may be transmitted by transmission media or signals such as electrical, electromagnetic, or digital signals, which may be conveyed via a communication medium such as a network and/or a wireless link, such as may be implemented via network interface 1040.

In one embodiment, I/O interface 1030 may coordinate I/O traffic between processor 1010, system memory 1020, and any peripheral devices in the device, including network interface 1040 or other peripheral interfaces, such as input/output devices 1050. In some embodiments, I/O interface 1030 may perform any necessary protocol, timing or other data transformations to convert data signals from one component (e.g., system memory 1020) into a format suitable for use by another component (e.g., processor 1010). In some embodiments, I/O interface 1030 may include support for devices attached through various types of peripheral buses, such as a variant of the Peripheral Component Interconnect (PCI) bus standard or the Universal Serial Bus (USB) standard, for example. In some embodiments, the function of I/O interface 1030 may be split into two or more separate components, such as a north bridge and a south bridge, for example. In addition, in some embodiments some or all of the functionality of I/O interface 1030, such as an interface to system memory 1020, may be incorporated directly into processor 1010.

Network interface 1040 may allow data to be exchanged between computer system 1000 and other devices attached to a network, such as other computer systems, or between nodes of computer system 1000. In various embodiments, network interface 1040 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices 1050 may, in some embodiments, include one or more display terminals, keyboards, keypads, touchpads, scanning devices, voice or optical recognition devices, or any other devices suitable for entering or retrieving data by one or more computer system 1000. Multiple input/output devices 1050 may be present in computer system 1000 or may be distributed on various nodes of computer system 1000. In some embodiments, similar input/output devices may be separate from computer system 1000 and may interact with one or more nodes of computer system 1000 through a wired or wireless connection, such as over network interface 1040.

Those skilled in the art will appreciate that computer system 1000 is merely illustrative and is not intended to limit the scope of the techniques as described herein. In particular, the computer system and devices may include any combination of hardware or software that can perform the indicated functions, including a computer, personal computer system, desktop computer, laptop, notebook, or netbook computer, mainframe computer system, handheld computer, workstation, network computer, a camera, a set top box, a mobile device, network device, internet appliance, PDA, wireless phones, pagers, a consumer device, video game console, handheld video game device, application server, storage device, a peripheral device such as a switch, modem, router, or in general any type of computing or electronic device. Computer system 1000 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a non-transitory, computer-accessible medium separate from computer system 1000 may be transmitted to computer system 1000 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium. Accordingly, the present invention may be practiced with other computer system configurations.

Various modifications and changes may be made as would be obvious to a person skilled in the art having the benefit of this disclosure. It is intended that the invention embrace all such modifications and changes and, accordingly, the above description to be regarded in an illustrative rather than a restrictive sense.

What is claimed is:

1. A system, comprising:
    a processor; and
    a memory, storing program instructions that when executed by the processor, cause the processor to implement a verification system, the verification system configured to:
        receive, via an interface of the verification system, an integrated circuit design under test;
        obtain a plurality of software-instructed commands to be performed to the design under test formatted according to an interface implemented by the design under test;
        generate a testbench for the design under test in a hardware description and verification language that includes a sequence to perform the plurality of software-instructed commands to the design under test before performing formal verification on the design under test;
        execute the testbench with respect to the design under test to perform the sequence to the design under test and to perform formal verification on the design under test; and
        provide, via the interface, a result of the execution of the testbench.

2. The system of claim 1, wherein the verification system is further configured to:
    receive, via an interface of the verification system, software that causes the plurality of software-instructed commands to be performed to the design under test; and
    receive, via the interface of the verification system, a software model of the design under test.

3. The system of claim 2,
    wherein to obtain the plurality of software-instructed commands to be performed to the design under test formatted according to the interface implemented by the design under test, the verification system is configured to:
        simulate execution of the software on a virtual platform using the software model of the design under test; and
        extract the plurality of software-instructed commands from the simulation; and
    wherein to generate the testbench, the verification system is configured to include respective locations and data for the plurality of software-instructed commands in the sequence as part of the testbench.

4. The system of claim 1, wherein to obtain the plurality of software-instructed commands to be performed to the design under test formatted according to the interface implemented by the design under test, the verification system is configured to receive the plurality of software-instructed commands via an interface of the verification system.

5. The system of claim 1, wherein the verification system is further configured to receive a request to perform formal verification for the design under test that causes performance of the obtaining, the generation, the execution, and the providing.

6. A method, comprising:
    obtaining, by a verification system, a plurality of software-instructed commands to be performed to configure a design under test formatted according to an interface implemented by the design under test;
    generating, by the verification system, a sequence to perform the plurality of software-instructed commands to configure the design under test in a hardware design and verification language;
    executing, by the verification system, the sequence to perform the plurality of software-instructed commands to configure the design under test; and
    after executing the sequence to perform the plurality of software-instructed commands to configure the design under test, performing formal verification on the configured design under test.

7. The method of claim 6, further comprising:
    receiving, via an interface of the verification system, software that causes the plurality of software-instructed commands to be performed to configure the design under test; and
    receiving, via the interface of the verification system, a software model of the design under test.

8. The method of claim 7,
    wherein obtaining the plurality of software-instructed commands to be performed to configure the design under test:
        simulating execution of the software on a virtual platform using the software model of the design under test to create a simulation; and
        extracting the plurality of software-instructed commands from the simulation;
    wherein generating the sequence to perform the plurality of software-instructed commands to configure the design under test in the hardware design and verification language comprises including the sequence that includes respective locations and data for the plurality of software-instructed commands as a part of a testbench; and
    wherein the execution of the sequence and the performance of the formal verification are caused by execution of the testbench.

9. The method of claim 5, wherein the design under test is a peripheral device and wherein the interface implemented by the design under device is a peripheral bus.

10. The method of claim 5, wherein the obtaining the plurality of software-instructed commands to be performed to configure the design under test, comprises receiving the plurality of software-instructed commands via the interface of the verification system.

11. The method of claim 5, further comprising providing, via an interface of the verification system, a result of the formal verification performed on the configured design under test.

12. The method of claim 5, further comprising receiving, via an interface of the verification system, the design under test.

13. The method of claim 5, wherein the obtaining, the generating, the executing, and the performing are performed in response to receiving a request to perform formal verification for the design under test.

14. One or more non-transitory, computer-readable storage media, storing program instructions that when executed on or across one or more computing devices cause the one or more computing devices to implement:
- receiving, at a verification system, a design under test;
- obtaining, by the verification system, a plurality of software-instructed commands to be performed to configure a design under test formatted according to an interface implemented by the design under test;
- generating, by the verification system, a sequence to perform the plurality of software-instructed commands to configure the design under test in a hardware design and verification language;
- executing, by the verification system, the sequence to perform the plurality of software-instructed commands to configure the design under test; and
- after executing the sequence to perform the plurality of software-instructed commands to configure the design under test, performing formal verification on the configured design under test.

15. The one or more non-transitory, computer-readable storage media of claim 14, storing further instructions that when executed by the one or more computing devices cause the one or more computing devices to further implement:
- receiving, via an interface of the verification system, software that causes the plurality of software-instructed commands to be performed to configure the design under test formatted according to an interface implemented by the design under test; and
- receiving, via the interface of the verification system, a software model of the design under test.

16. The one or more non-transitory, computer-readable storage media of claim 15,
- wherein, in obtaining the plurality of software-instructed commands to be performed to configure the design under test formatted according to the interface implemented by the design under test, the program instructions cause the one or more computing devices to implement:
  - simulating execution of the software on a virtual platform using the software model of the design under test; and
  - extracting the plurality of software-instructed commands from the simulation;
- wherein, in generating the sequence to perform the plurality of software-instructed commands to configure the design under test in the hardware design and verification language, the program instructions cause the one or more computing devices to implement including the sequence that includes respective locations and data for the plurality of software-instructed commands as a part of a testbench; and
- wherein the execution of the sequence and the performance of the formal verification are caused by execution of the testbench.

17. The one or more non-transitory, computer-readable storage media of claim 14, wherein the design under test is a peripheral device and wherein the interface implemented by the design under device is a peripheral bus.

18. The one or more non-transitory, computer-readable storage media of claim 17, storing further instructions that when executed by the one or more computing devices cause the one or more computing devices to further implement providing, via an interface of the verification system, a result of the formal verification performed on the configured design under test.

19. The one or more non-transitory, computer-readable storage media of claim 14, wherein, in obtaining the plurality of software-instructed commands to be performed to configure the design under test, the program instructions cause the one or more computing devices to implement receiving the plurality of software-instructed commands via an interface of the verification system.

20. The one or more non-transitory, computer-readable storage media of claim 14, wherein, in obtaining the plurality of software-instructed commands to be performed to configure the design under test, the program instructions when executed by the one or more computing devices, cause the one or more computing devices to implement accessing a database of registered software-instructed commands responsive to a request to use the plurality of software-instructed commands.

* * * * *